United States Patent [19]
Sakamoto

[11] Patent Number: 5,650,664
[45] Date of Patent: Jul. 22, 1997

[54] CONNECTOR EFFECTING AN IMPROVED ELECTRICAL CONNECTION AND A SEMICONDUCTOR APPARATUS USING SUCH CONNECTOR

[75] Inventor: Masaru Sakamoto, Atsugi, Japan

[73] Assignee: Canon Kabushiki Kaisha, Tokyo, Japan

[21] Appl. No.: 21,670

[22] Filed: Feb. 24, 1993

[30] Foreign Application Priority Data

Feb. 28, 1992 [JP] Japan ..................... 4-075981

[51] Int. Cl.⁶ .................. H01L 23/48; H01L 23/52; H01L 29/40
[52] U.S. Cl. .................. 257/764; 349/139; 257/763
[58] Field of Search .................. 257/763, 764, 257/765, 770; 359/88, 59; 349/46, 47, 139, 143

[56] References Cited

U.S. PATENT DOCUMENTS

| | | |
|---|---|---|
| 4,646,424 | 3/1987 | Parks et al. ........................... 257/350 |
| 5,208,690 | 5/1993 | Hayashi et al. ....................... 359/88 |
| 5,285,301 | 2/1994 | Shirahashi et al. . |
| 5,367,179 | 11/1994 | Mori et al. . |
| 5,402,254 | 3/1995 | Sasano et al. . |

FOREIGN PATENT DOCUMENTS

| | | |
|---|---|---|
| 211402 | 2/1987 | European Pat. Off. ........ H01L 21/84 |
| 313199 | 4/1989 | European Pat. Off. ........ G02F 1/133 |
| 315319 | 5/1989 | European Pat. Off. ........ G02F 1/133 |
| 62-250422 | 10/1977 | Japan ..................................... 359/88 |
| 58-190063 | 11/1983 | Japan . |
| 59-22361 | 2/1984 | Japan . |
| 59-40582 | 3/1984 | Japan . |
| 3-234025 | 10/1991 | Japan ........................... H01L 21/318 |

OTHER PUBLICATIONS

Applied Physics Letters, vol. 42, No. 4, 15 Feb. 1983 at p. 388.

J. of the Electrochemical Soc., vol. 127, No. 2 Feb. 1980 at 476-83 "Formation Mechanism Of Porous Silicon Layer" by Takashi Unagami.

Solid State Electronics, vol. 24, 1981, at ppl 159-64 "A New Dielectric Isolation Method Using Porous Silicon" by Kazuo Imai.

J. Of The Electrothermal Soc. vol. 130, No. 7 Jul. 1983 at 1611-14 "Pore Size Distribution In Porous Silicon" by G. Bomchil, et al.

Bell System Tech. J., vol. 35, Mar., 1956 at 333 "Electrolytic Shaping Of Germanium & Silicon" by A. Uhlir, Jr.

*Primary Examiner*—Mahshid D. Saadat
*Assistant Examiner*—S. V. Clark
*Attorney, Agent, or Firm*—Fitzpatrick, Cella, Harper & Scinto

[57] ABSTRACT

A semiconductor apparatus exhibiting excellent contact characteristics, high operational speed and low electric power consumption is realized by forming a layer made of Ti or a Ti compound between an oxide containing indium such as a thin ITO film and a Si region.

14 Claims, 6 Drawing Sheets

CONNECTOR EFFECTING AN IMPROVED ELECTRICAL CONNECTION AND A SEMICONDUCTOR APPARATUS USING SUCH CONNECTOR

BACKGROUND OF INVENTION

1. Field of the Invention

The present invention relates to a semiconductor apparatus and a connector for use in the semiconductor apparatus, and more particularly to a semiconductor device which can be preferably used in a liquid crystal apparatus and a photoelectrical conversion apparatus and the like and a connector capable of stably establishing excellent electrical contact with a transparent electrode of the liquid crystal display apparatus or the photoelectrical conversion apparatus and which is used in the semiconductor apparatus.

2. Description of the Prior Art

Hitherto, a variety of structures have been disclosed to establish a contact between n or p type Si and an oxide which contains indium such as ITO (indium-tin oxide) serving as a transparent electrode. For example, a structure has been disclosed in Japanese Patent Laid-Open No. 58-190063, in which Si and an ITO film are directly in contact with each other. Another structure has been disclosed in Japanese Patent Laid-Open No. 59-22361 and Japanese Patent Laid-Open No. 59-40582 which has an arrangement that Si and the ITO film are brought into contact with each other through a barrier metal such as In and Sn.

However, the conventional methods encounter problems in that an ohmic contact cannot easily be established, an excessively large contact resistance of $K\Omega$ to $M\Omega$ is generated and the contact resistance value is further enlarged in a process (a heat treatment at 250° C. or higher) used for laying down a layer-insulating film by evaporation after the ITO has been formed by evaporation. Therefore, the electronic characteristics disperse, the signal transmission is delayed, and the electric characteristics and the reliability deteriorate.

SUMMARY OF THE INVENTION

An object of the present invention is to provide a connector capable of overcoming the foregoing problems and having excellent contact characteristics and to provide a semiconductor apparatus exhibiting high speed operational speed and low electric power consumption by using the connector. Furthermore, another object of the present invention is to provide a liquid crystal display apparatus and a photoelectrical conversion apparatus each of which uses the semiconductor apparatus to form a high quality image.

That is, an object of the present invention is to provide a connector capable of, while reducing resistance, reliably establishing an electrical connection between Si forming a semiconductor device and an oxide containing indium such as ITO for uses as a transparent electrode.

Another object of the present invention is to provide a semiconductor apparatus in which Si forming the semiconductor device and an oxide containing indium are electrically connected to each other while revealing excellent electrical characteristics.

Another object of the present invention is to provide a connector for establishing an electrical connection between a silicon semiconductor and an oxide containing indium, the connector containing at least Ti or a Ti compound.

Another object of the present invention is to provide a semiconductor apparatus which can be used in a liquid crystal display apparatus or a photoelectrical conversion apparatus, the semiconductor apparatus comprising a silicon semiconductor region, an oxide electrically connected to the silicon semiconductor region and containing indium and a connector disposed between the silicon semiconductor region and the oxide containing indium and made of Ti or a Ti compound for establishing an electrical connection between the silicon semiconductor and the oxide.

DESCRIPTION OF THE PREFERRED EMBODIMENTS

Figure 1A:
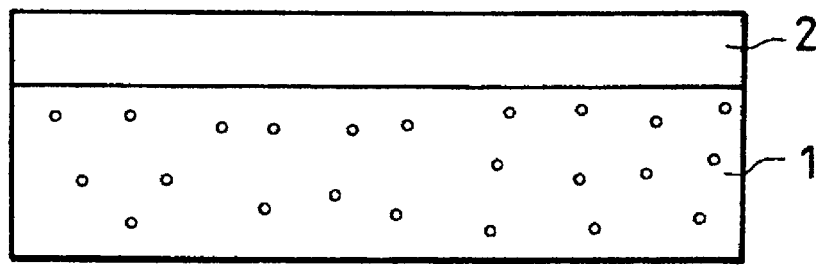
FIGS. 1(a) to 1(c) are schematic cross sectional views which respectively illustrate an example of a process for manufacturing a SOI (Silicon On Insulator) substrate which can being applied to the present invention.

The present invention has an arrangement that a connector comprising Ti or a Ti compound is formed between Si and a film of an oxide containing indium to improve the electrical contact between Si and the film (a layer) of the oxide containing indium such as indium oxide or ITO.

That is, the present invention has an arrangement that Si or an oxide film containing indium is formed and then an oxide film containing indium or Si is formed while interposing a connector made of Ti or a Ti compound in place of an arrangement in which the electrical contact is established by bringing Si and the film of the oxide containing indium into direct contact with each other. If the Ti compound can be expressed by TiOaNb, it is preferable to make a>0 and b≧1. If it can be expressed by TiNc, it is preferable to make c≧1.

As a result of the arrangement thus made, the problem of the dispersion of the electrical characteristics between the contact portion and the semiconductor apparatus can be overcome. Furthermore, the problem of the signal transmission delay can be overcome.

Furthermore, the aforesaid structure enables the problem of reliability deterioration due to the electrical characteristics and the structure of the connection portion, to be overcome. The reason for this is that the Ti compound is thermally stable and can be ohmic-connected to silicon, which in contrast In and Sn cannot be ohmic-connected to silicon and are thermally unstable.

If the present invention is adapted to a liquid crystal apparatus or a photoelectric conversion apparatus, the pixel-to-pixel non-uniformity of the displaying performance and the reading performance can be significantly prevented. Furthermore, such dispersion of the displaying characteristics and reading characteristics as between apparatuses can be prevented satisfactorily.

The arrangement of the preferred embodiments of the present invention will now be described in detail.

The Si semiconductor according to the present invention may be a Si semiconductor formed on an insulating substrate such as a glass substrate or a single-crystal Si substrate.

If the semiconductor apparatus according to the present invention is adapted to a liquid crystal display apparatus, use of a semiconductor substrate having a single-crystal Si layer manufactured by the following method will enable a liquid crystal device, a liquid crystal drive circuit and its peripheral drive circuits to be simultaneously formed on the same substrate.

As a result of the structure thus arranged, the manufactured liquid crystal display apparatus has excellent electric characteristics and its size can be further reduced.

If a so-called active matrix liquid crystal display apparatus having a TFT (Thin Film Transistor) for each pixel thereof is manufactured, an arrangement may be employed in which the peripheral drive circuit portion is manufactured by the following method and the TFT portion corresponding to each pixel is formed by a polycrystalline Si semiconductor layer.

The connector according to the present invention is able to establish a connection between the polycrystalline Si semiconductor layer or an amorphous Si semiconductor layer and the oxide containing indium as well as establish a connection between the single-crystal Si semiconductor layer and the oxide containing indium.

Since a preferred example of the present invention uses a Si semiconductor substrate in which a single crystal Si layer is formed on an insulating base material by using porous Si, the porous Si substrate is first described below.

The porous Si substrate has pores having an average size of about 600 Å which is determined by observation using a transmission electron microscope. Although the density of the porous Si substrate is less than half that of single crystal Si, the single crystallinity is maintained, and a single crystal Si layer can be formed on the porous layer by epitaxial growth. However, at a temperature of 1000° C. or more, the internal pores are rearranged, and the etching properties (to be described later) deteriorate when the etching speed is increased. It is therefore preferable for epitaxial growth of the Si layer to use a low-temperature growth method such as a molecular beam epitaxial growth method, a plasma CVD method, a thermal CVD method, an optical CVD method, a bias sputtering method, a liquid crystal growth method or the like.

A method of epitaxially growing a single crystal layer after p-type Si is made porous is described below.

A Si single crystal substrate is prepared and made porous by anodization using an HF solution. Although the density of single crystal Si is 2.33 g/cm³, the density of the porous Si substrate can be changed to 0.6 to 1.1 g/cm³ by changing the concentration of the HF solution to 20 to 50% by weight. The porous layer is easily formed into a p-type Si substrate for the reasons below.

Porous Si was discovered by Uhlir et at. in the course of research on electropolishing of a semiconductor in 1956 (A. Uhlir, Bell Syst. Tech. J., vol. 35, p. 333 (1965)). Unagami et al. investigated Si dissolution reaction in anodization and reported that the Si anodization in an HF solution requires holes and proceeds in accordance with the following reaction formulas (T. Unagami: J. Electrochem. Soc., vol. 127, p. 476 (1980)):

Si+2HF+(2−n)e⁺→SiF₂+2H⁺+ne⁻

SiF₂+2HF→SiF₄+H₂

SiF₄+2HF→H₂SiF₆ or

Si+4HF+(4−λ)e⁺→SiF₄+4H⁺+λe⁻

SiF₄+2HF→H₂SiF₆ wherein e⁺ and e⁻ indicate a hole and an electron, respectively, n and λ each indicate the number of holes required for dissolving one Si atom. It was also reported that when the conditions of n>2 or λ>4 are satisfied, porous Si is formed.

Therefore, p-type Si in which holes are present can be easily made porous.

On the other hand, it has been reported that high density n-type Si also can be made porous (R. P. Holmstorm, I. J. Y. Chi. Appl. Phys. Lett., Vol. 422, 386 (1983)). Both p-type and n-type Si can thus be made porous.

In addition, since the porous layer contains the large void formed therein, the density is reduced by at least half. As a result, the surface area is significantly increased, as compared with the volume thereof, and the chemical etching speed is thus significantly increased, as compared with the etching speed of a usual single crystal layer.

The conditions for making single crystal Si porous by anodization are described below. The starting material of the porous Si formed by anodization is not limited to single crystal Si, and Si having other crystal structures can be used.

Applied voltage: 2.6 (V)
Current density: 30 (mA·cm⁻²)
Anodization solution: HF:H₂O:C₂H₅OH=1:1:1
Time: 2.4 (hr)
Thickness of porous Si: 300 (μm)
Porosity: 56 (%)

Si is deposited on the thus-formed porous Si substrate by epitaxial growth to form a single crystal Si thin film. The thickness of the single crystal Si thin film is preferably 50 μm or less, more preferably 20 μm or less.

After the surface of the single crystal Si thin film is oxidized, a substrate which finally forms a substrate is prepared and bonded to the oxide film on the surface of the single crystal Si. Alternatively, after the surface of a new single crystal Si substrate is oxidized, the new substrate is bonded to the single crystal Si layer on the porous Si substrate. The reason for providing the oxide film between the substrate and the single crystal Si layer is described below. For example, when a glass substrate is used, since the surface potential generated at the boundary between the Si active layer and the oxide film can be decreased, as compared with the boundary between the Si active layer and the glass substrate, the characteristics of an electron device can be significantly improved. In addition, only the single crystal Si thin film obtained by removing the porous Si substrate by the selective etching described below may be bonded to a new substrate. After washing, the substrate can be sufficiently bonded to the single crystal Si thin film using van der Waals force by simply bringing both surfaces into contact with each other. It is preferable that both substrates are then completely bonded by further heat treatment in an atmosphere of nitrogen at 200° to 900° C., preferably 600° to 900° C.

A Si₃N₄ layer is then deposited as an anti-etching film over the whole surface of the two substrates bonded, and only the portion of the Si₃N₄ layer on the surface of the porous Si substrate is removed. Wax as an anti-etching film may be used in place of the Si₃N₄ layer. The porous Si substrate is then completely removed by etching or the like to obtain a semiconductor substrate having the thin film single crystal Si layer.

Selective etching for electrodes using wet etching of the porous Si substrate is described below.

Preferred examples of etching solutions which do not etch crystal Si but which can selectively etch porous Si include hydrofluoric acid, buffered hydrofluoric acid such as ammonium fluoride ($NH_4F$), hydrogen fluoride (HF) and the like, a mixture of hydrogen peroxide and hydrofluoric acid or buffered hydrofluoric acid, a mixture of an alcohol and hydrofluoric acid or buffered hydrofluoric acid, and a mixture of hydrogen peroxide, an alcohol and hydrofluoric acid or buffered hydrofluoric acid. The etching is effected by wetting the bonded substrates with the etching solution. The etching speed depends upon the concentration and temperature of hydrofluoric acid, buffered hydrofluoric acid or hydrogen peroxide. The speed of Si oxidation can be increased by adding a hydrogen peroxide solution, as compared with etching without the hydrogen peroxide solution. The reaction speed can also be controlled by changing the ratio of the hydrogen peroxide solution added. In addition, the addition of an alcohol permits the bubbles of the gases produced by the etching reaction to be instantaneously removed from the etched surface without agitation, and thus permits efficient and uniform etching of porous Si.

The HF concentration in the buffered hydrofluoric acid is preferably set within the range of 1 to 95% by weight, more preferably 1 to 85% by weight, and most preferably 1 to 70% by weight, based on the etching solution. The $NH_4F$ concentration in the buffered hydrofluoric acid is preferably set within the range of 1 to 95% by weight, more preferably 5 to 90% by weight, and most preferably 5 to 80% by weight, based on the etching solution.

The HF concentration in the hydrofluoric acid solution is preferably set within the range of 1 to 95% by weight, more preferably 5 to 90% by weight, and most preferably 5 to 80% by weight, based on the etching solution.

The $H_2O_2$ concentration is preferably set within the range of 1 to 95% by weight, more preferably 5 to 90% by weight, and most preferably 10 to 80% by weight, based on the etching solution, and within the range which allows the hydrogen peroxide to exhibit the effect.

Any alcohols such as ethyl alcohol, isopropyl alcohol and the like, which have no practical difficulty and from which the usual effect of adding an alcohol can be expected can be used in the etching step. The alcohol concentration is preferably set to be 80% by weight or less, more preferably 60% by weight or less, and most preferably 40% by weight or less, based on the etching solution, and within the range which allows the alcohol to exhibit the effect.

The temperature is preferably set within the range of 0° to 100° C., more preferably 5° to 80° C., and most preferably 5° to 60° C.

The semiconductor substrate formed by the above process has the flat single crystal Si layer which is uniformly thinned and formed over the large area of the substrate, like usual Si wafers. The single crystal Si layer of the semiconductor substrate is then separated into portions by partial oxidation or etching in an island-like form and doped with impurities to form p- or n-channel transistors.

The selectivity for making the Si substrate porous is verified by Nagano et al. and Imai (Nagano, Nakajima, Ohnaka, Kakiwara; the technical report of Institute of Electronics and Communication Engineers of Japan, vol. 79, SSD 79-9549 (1979), K. Imai; Solid-State Electronic vol. 24, 159 (1981)). As described above, p-type and n-type silicon can both be made porous easily and selectively.

It is thus important to select a substrate which can be actually made porous regardless of the p- or n-type.

In addition, the porous Si layer has pores having an average size of about 600 Å which is determined by observation on a transmission electron microscope. Although the density of the porous Si layer is about half of that of single crystal Si, the single crystallinity is maintained.

Known methods of etching porous Si are the following:
(1) a method of etching porous Si by an aqueous NaOH solution (G. Bonchil, R. Herino, K. Barla, and J. C. Pfister, J. Electrohcem. Soc., vol. 130, No. 7, 1611 (1983)): and
(2) a method of etching porous Si by the above etching solution which can etch single crystal Si.

The above method (2) generally uses a fluoronitric acid etching solution, as described above. The Si etching step is further described in detail below: The etching reaction proceeds as following:

$$Si + 2O \rightarrow SiO_2$$
$$SiO_2 + 4HF \rightarrow SiF_4 + H_2O$$

Namely, Si is oxidized to $SiO_2$ by nitric acid, and etching of Si proceeds as $SiO_2$ is etched by hydrofluoric acid.

Examples of etching solutions other than the fluoronitric acid etching solution used for etching crystal Si include the following:

ethylenediamine type

KOH type hydrazine type

The dependency is further described below with reference to FIGS. 1(a) to 1(c).

A single crystal Si layer 2 having a thickness of about 1 μm was formed, by the CVD process, on the porous Si substrate 1 formed under the above conditions (FIG. 1(a)).

Figure 1B:
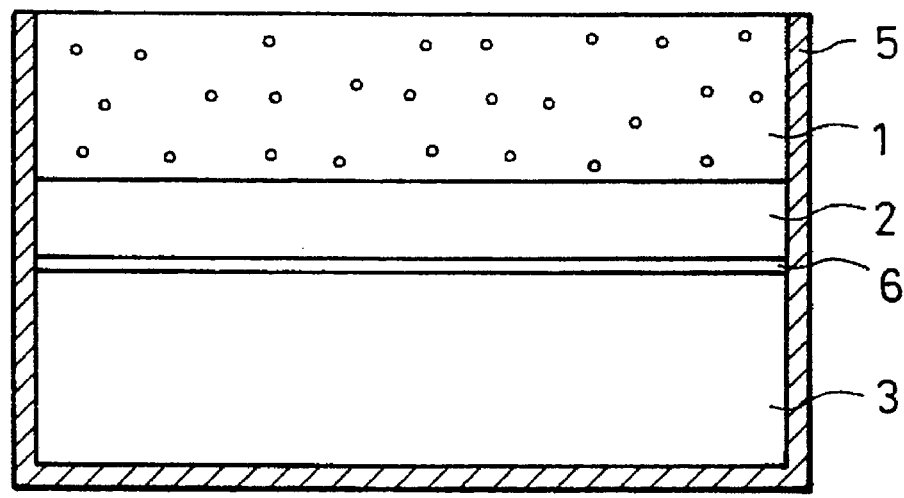

As shown in FIG. 1(b), a light transmitting glass substrate 3 is prepared and is bonded to the surface of the single crystal Si layer 2 on the porous Si substrate 1. In the bonding step, both surfaces to be bonded are brought into close contact with each other and then heated at 900° C. in an atmosphere of oxygen or nitrogen. Before the bonding step, an oxide layer 6 serving as an insulating layer may be formed on the surface of the nonporous single crystal Si layer 2. The oxide layer 6 is formed for the purpose of decreasing the surface potential of the single crystal silicon layer 2 finally serving as an active layer.

If required, the whole surface of the two substrate bonded is covered with a $Si_3N_4$ layer serving as an anti-etching layer 5, and the $Si_3N_4$ layer on the porous surface of the porous silicon substrate 1 is removed. Wax may be used as the anti-etching layer 5 in place of the $Si_3N_4$ layer.

The bonded substrates are then wetted with a mixture containing 49% hydrofluoric acid, an alcohol and hydrogen peroxide (10:6:50) (white dot) without agitation. As a result, the porous Si could be rapidly and uniformly etched while possessing excellent surface characteristics. The etching speed depends upon the concentration of the etching solution and the temperature thereof.

As described above, bubbles of the gas generated due to the etching reaction can be instantaneously removed from the etched surface while eliminating a necessity of agitation by adding the alcohol in particular. Therefore, the porous Si can be uniformly and efficiently etched. By adding hydrogen peroxide in particular, the Si oxidation speed can be raise and the reaction speed can be raised as compared with a reaction performed without hydrogen peroxide. Furthermore, the reaction speed can be controlled by changing the ratio of hydrogen peroxide.

Any alcohols such as ethyl alcohol, isopropyl alcohol and the like, which have no practical difficulty and from which the usual effect of adding an alcohol can be expected can be used in the etching step.

In this way, the porous Si substrate 1 is completely etched, leaving the single crystal thin silicon layer 2 formed on the light transmitting glass 3.

Before the etching step, the rear side of the porous Si substrate 1 (porous layer) may be thinned by machining such as grinding, polishing or the like. Particularly, when the Si substrate is partially made porous, it is preferable to thin the Si substrate by machining until the porous layer 1 is exposed.

Figure 1C:
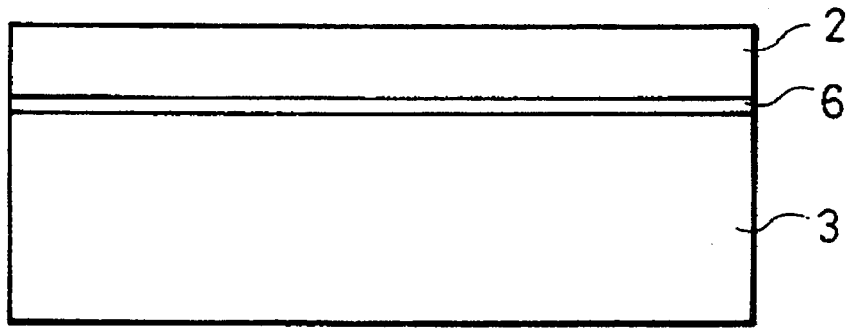

FIG. 1(c) shows the semiconductor substrate obtained in the present invention. Namely, the $Si_3N_4$ layer serving as the anti-etching layer 5 and the porous layer 1 shown in FIG. 1(b) are removed to uniformly form the single crystal Si layer 2 having a large area and the same crystallinity as that of a silicon wafer over the whole area of the light transmitting glass substrate 3.

A description will now be made of an example of the method of producing a transistor with reference to FIGS. 2(a) to FIG. 2(d). Of course, the production method and the transistor structure are not limited to those described below, and other structures and other production methods may also be employed.

Figure 2A:
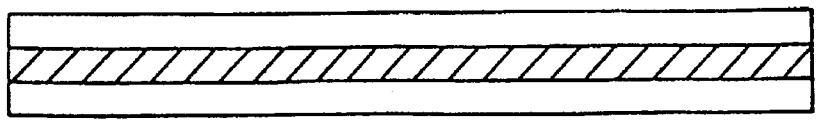
FIGS. 2(a) to 2(e) and 4(a) to 4(c) are schematic cross-sectional views which illustrate a preferred embodiment of a process of the present invention.
Figure 2B:
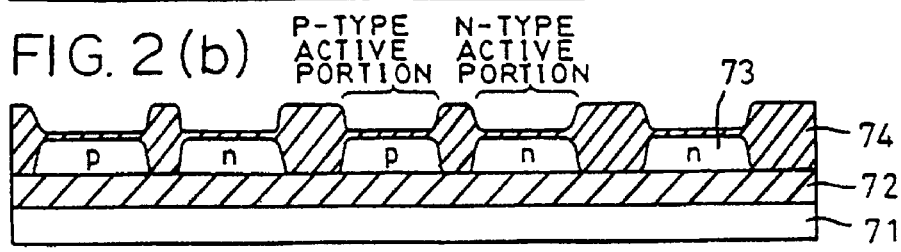

FIG. 2(a) shows the semiconductor substrate obtained by the above method. In FIG. 2(a), reference numeral 71 denotes a glass substrate; reference numeral 72, an insulating layer, and reference numeral 73, a single crystal silicon layer. After a silicon oxide film of 200 to 1000 Å is formed on the semiconductor substrate by thermal oxidation, a silicon nitride film of 100 to 500 Å is formed by the LPCVD process, is patterned to a desired shape and is then subjected to selective oxidation (LOCOS) of silicon at 1000° C. for 1 to 6 hours. In this case, the portion 74 selectively oxidized may be extended to the lower insulating layer so as to be completely separated from the adjacent active portion, as shown in FIG. 2(b), or the single crystal silicon layer may be connected in the horizontal direction by forming a channel stop layer. P-type active portions and n-type active portion are then formed by photolithography and ion implantation, as shown in FIG. 2(b).

Polysilicon is then deposited to a thickness of 500 to 5000 Å by the LPCVD process. Since the polysilicon layer can be used as a material for MOSFET gate electrode and as a wiring layer, the polysilicon layer is preferably as thick as possible in order to decrease the electrical resistance. Alternatively, a metal silicide (tungsten, titanium or the like) may be laminated on the polysilicon layer having a thickness of about 2000 Å in order to decrease the resistance.

Figure 2C:
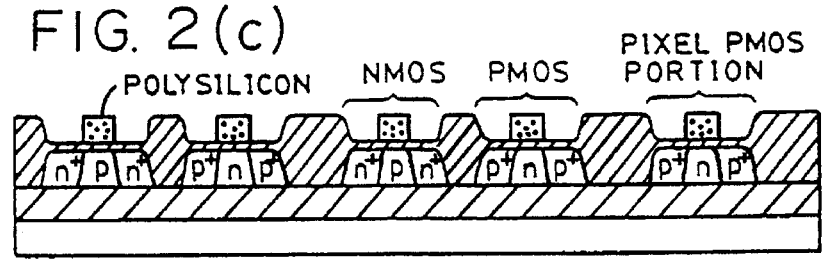

The polysilicon layer is then patterned, and arsenic or phosphorus ions and boron or boron fluoride ions are implanted in the NMOS portion and PMOS portions, respectively, followed by heat treatment at 500° to 1000° C. to obtain the structure shown in FIG. 2(c). The structure shown in FIG. 2(c) is a single drain structure in which both the $n^+$ layer and $p^+$ layer in the NMOS and PMOS portions directly contact with the channel region. However, for example, $n^-$ and $p^-$ layers may be respectively formed between the $n^+$ and $p^+$ layers and the channel layer by an additional step so as to relieve the electrical field produced at the PN junction, thereby enabling the transistor to be driven at a higher voltage. The inventor also found from experiment that when a power voltage of 10 V or more is required, the above structure for relieving the electrical field is effective.

A BPSG film is then deposited to a thickness of 3000 to 8000 Å by the CVD process to form a first layer-insulating layer 75. After contact holes are formed for leading out electrodes, an aluminium electrode is formed to a thickness of 3000 to 8000 Å by the sputtering method except for a portion which is in contact with an ITO to be described later. A Ti electrode is formed in the portion in contact with the ITO to have a thickness of 3000 to 8000 Å by a sputtering method. After the aluminum electrode 78 and Ti electrode 77 are formed, a silicon nitride film or a silicon oxide film is deposited to a thickness of 3000 to 10000 Å by the plasma excitation or thermal CVD process. This silicon nitride or silicon oxide film serves as a second layer-insulating layer 76. At this time, it is effective for the reasons below to flatten the semiconductor surface as much as possible by rotating the semiconductor substrate.

Flattening decrease the problem of the second and higher wiring layers disconnecting, which is caused by a large difference in evenness when multi-layer wiring is provided. Also, flattening causes uniform orientation treatment for orienting a liquid crystal and thus improves the quality of an image formed by the matrix panel.

Figure 2D:
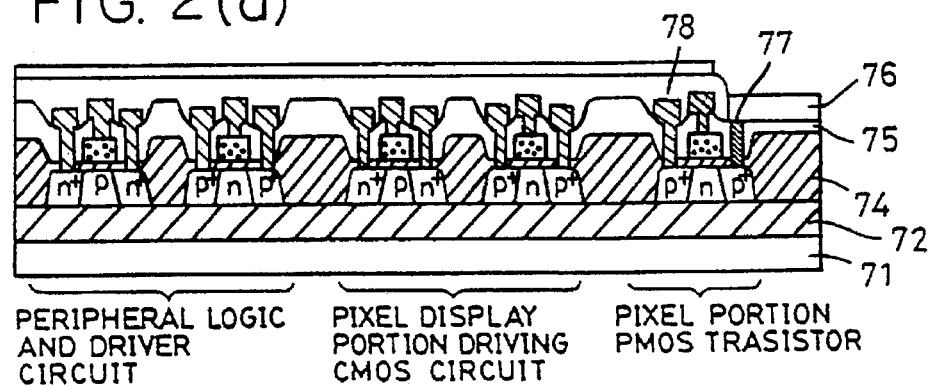
Figure 2E:
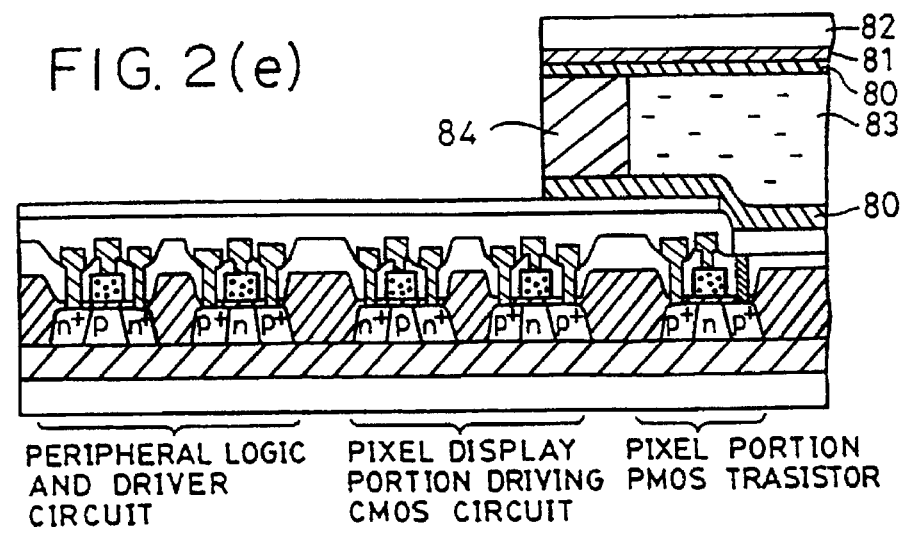

ITO is deposited to a thickness of 500 to 2000 Å to form a transparent electrode 76 by sputtering in an atmosphere of argon and oxygen. FIG. 2(d) shows the structure obtained after ITO patterning. An orientation film 80 is then deposited and is subjected to orientation treatment, and a liquid crystal material 83 is then charged in the display portion. These steps are the same as those of a conventional method of forming a liquid crystal panel. FIG. 2(e) shows an example of the liquid crystal display device formed by the above method.

In FIG. 2(e), reference numeral 80 denotes an orientation film; reference numeral 81 a counter electrode; reference numeral 82, a glass plate; reference numeral 83, a liquid crystal material; and reference numeral 84, a sealing material. The pixel portion transistor is provided in correspondence with each of the pixels. In the right portion of the liquid crystal display device not shown in FIG. 2(e), the pixel portion transistor and the storage capacity portion are repeatedly formed in the number of required pixels.

Figure 2F:
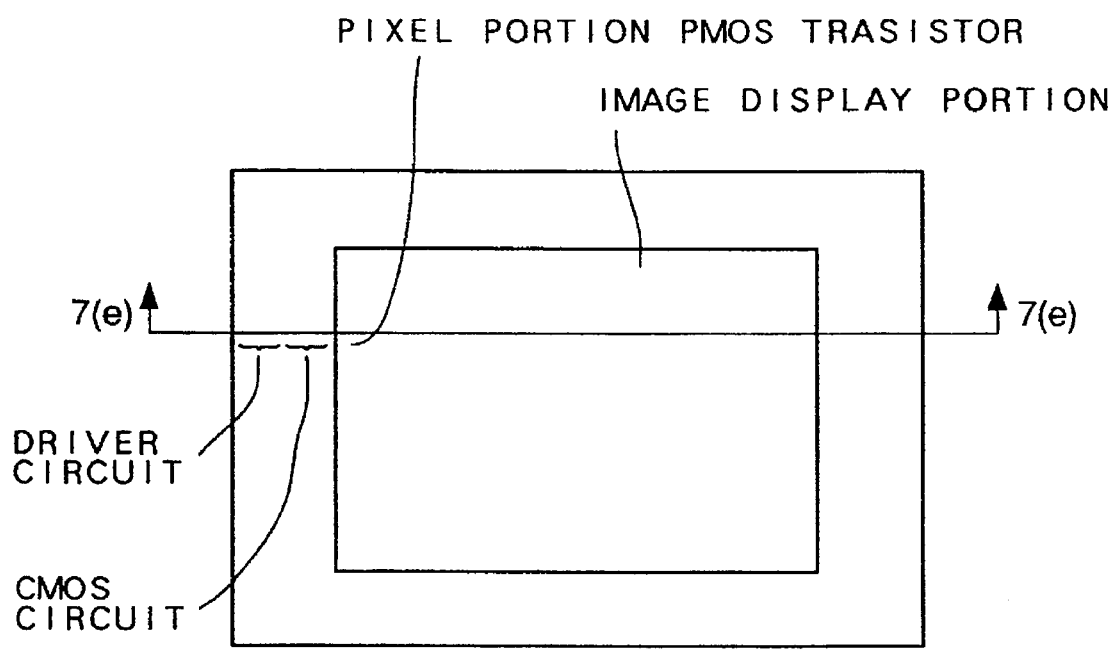
FIG. 2(f) is a schematic plan layout view which illustrates portions of the preferred embodiment of the liquid crystal display apparatus shown in FIG. 2(e)

FIG. 2(f) is a schematic plan view of the liquid crystal display device formed. FIG. 2(e) is thus a schematic sectional view of the liquid crystal display device taken along line 7(e)—7(e) of FIG. 2(f) and shows the first transistor and storage capacity portion on the left side of the image display portion.

Although the transistor of the pixel portion shown in FIG. 2(d) comprises PMOS, NMOS can, of course, also be used for realizing the same function by the same process.

In the semiconductor device formed by the above method, the display pixel portion, the driving circuit therefor, the peripheral logic circuit and the driver circuit are formed on the same chip, as shown in FIG. 2(d). It is thus possible significantly to decrease the total cost including packaging, and to form a very compact module. When the same circuit is realized by the polysilicon TFT technique which is generally used, the size of the whole chip is increased to about 10 times that of the chip of the present invention.

As described above, this example has an arrangement that Ti is interposed as a connector when single crystal Si and the ITO transparent electrode are electrically connected to each other. Therefore, the influence of oxygen contained by the ITO film on single crystal Si at the time of forming the ITO film can be prevented. Ti can be in electrically contact with single crystal Si satisfactorily and electrically contact with the ITO satisfactorily. Therefore, Ti serves as an excellent connector.

The surface of the Ti facing the ITO is oxidized by oxygen contained by the ITO film and is made a Ti oxide while maintaining its electrical contact. Therefore, the formed liquid crystal display apparatus is able to satisfactorily display an image while overcoming a problem of the signal transmission delay and a problem of the image deterioration and dispersion due to the connection.

Another embodiment of the present invention will now be described with reference to the drawings.

The foregoing embodiments have an arrangement that the PMOS transistors formed to correspond to the pixels are formed by using single crystal Si. However, it is difficult to form single crystal Si on the overall surface of the liquid crystal display apparatus if a large area liquid crystal display apparatus is intended to be obtained. An embodiment having an arrangement in which polysilicon TFT is used as the transistors corresponding to the pixels will now be described.

The description will be mainly made about the portion in which the TFT and the ITO film are connected to each other.

Figure 3:
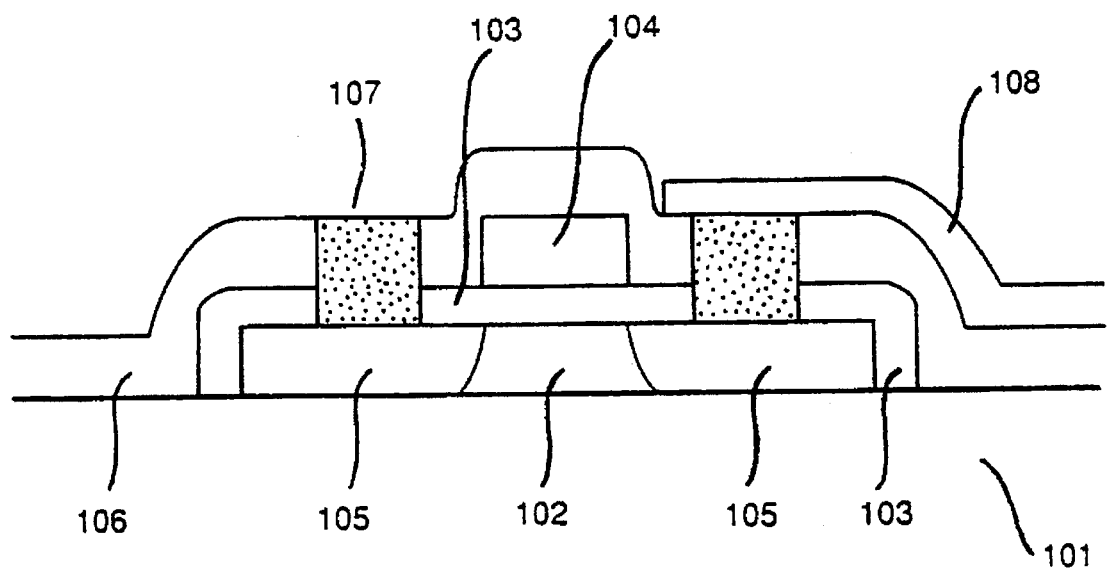
FIG. 3 and FIG. 5 are schematic cross-sectional views which illustrate another preferred embodiment of the present invention.

FIG. 3 is a schematic enlarged cross-sectional view which illustrates a contact structure according to this embodiment. Referring to FIG. 3, a polysilicon TFT is formed on a glass substrate 101. Furthermore, an ITO film 108 is formed on the polysilicon TFT while interposing an insulating film 106. Reference numerals 102 to 105 respectively represent a channel portion, a layer-insulating layer, a gate electrode and a source-drain region.

This embodiment has an arrangement in which a Ti film 107 is formed to serve as a connector formed in the portion in which the source-drain region 105 and the ITO film 108 are in contact with each other. As a result, oxygen does not disperse to reach the source-drain region 105. By forming the Ti film 107, at least a portion of the Ti film 107 is oxidized to be a Ti oxide. However, oxygen contained by the ITO film 108 migrates to the source-drain region 105 due to a heat treatment to be performed afterwards so that the deterioration of the contact characteristics is prevented.

The manufacturing process will now be schematically described with reference to FIGS. 4(a) to 4(c).

Figure 4A:
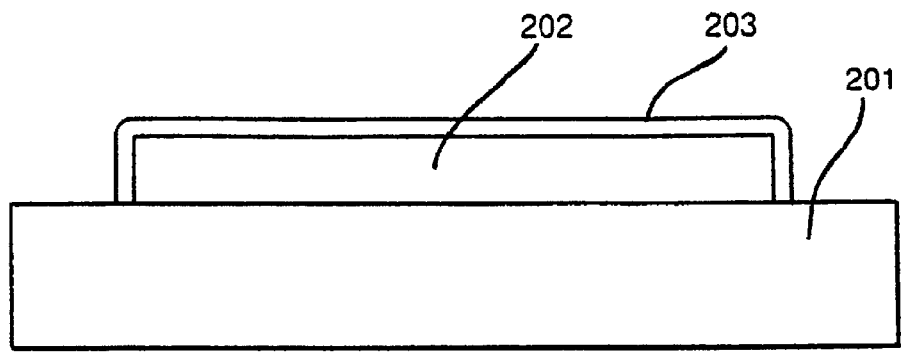

As shown in FIGS. 4(a), a polycrystal silicon 202 to serve as a channel portion is formed on a glass substrate 201 followed by patterning, causing a gate film 203 to be formed.

Figure 4B:
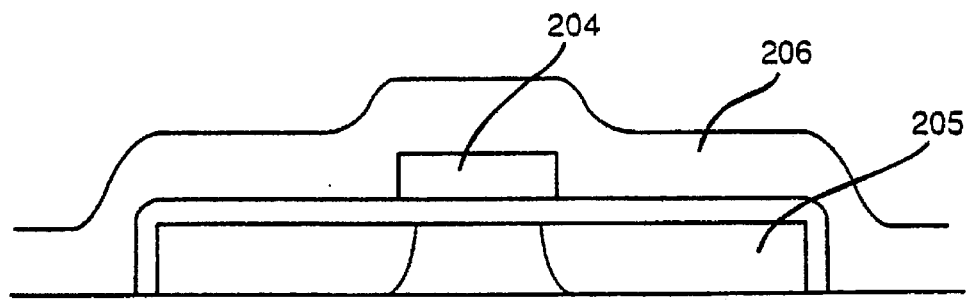
Figure 4C:
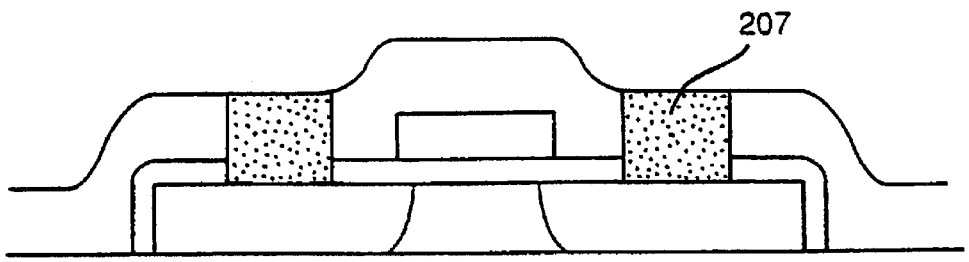

A gate electrode 204 is formed as shown in FIG. 4(b) followed by patterning, and then a source-drain 205 is ion-implanted while using the gate electrode 204 as a mask. Then, a layer-insulating layer 206 is formed.

A through (contact) hole is formed in the source-drain region 205 by using an RIE. Then, a Ti 207 is formed by a CVD method or a sputtering method. The film thickness must be 500 Å to satisfactorily hinder oxygen, preferably 1000 Å or more because the particle size varies depending upon the film forming method.

Then, the Ti layer 207 is patterned so that ITO is formed. The ITO according to this embodiment was formed by the sputtering method because it is difficult for the CVD method to form ITO that has a small resistance value due to a fact that the characteristics of the film vary depending upon the content of oxygen in ITO in the CVD method.

The ITO was evaporated under conditions that: the temperature of the substrate was 200° C., and the sputtering was performed by 300 W in an Ar and $O_2$ (1%) atmosphere (1 Pa).

Then, the contact resistance was measured, resulting in a contact resistance of 50Ω or less when the contact size was 3 μm×3 μm.

Also in this case, a liquid crystal display apparatus displaying excellent characteristics could be manufactured.

Then, a liquid crystal display apparatus was manufactured by a method similar to that according to the first embodiment except for a fact that TiON or TiN was used in place of Ti 107.

As a result, the contact resistance was further reduced as compared with that realized in the first embodiment, and a contact resistance of 20Ω or less was realized. The contact resistance was further stabled by increasing the film thickness from 1000 Å to 2000 Å.

Figure 5:
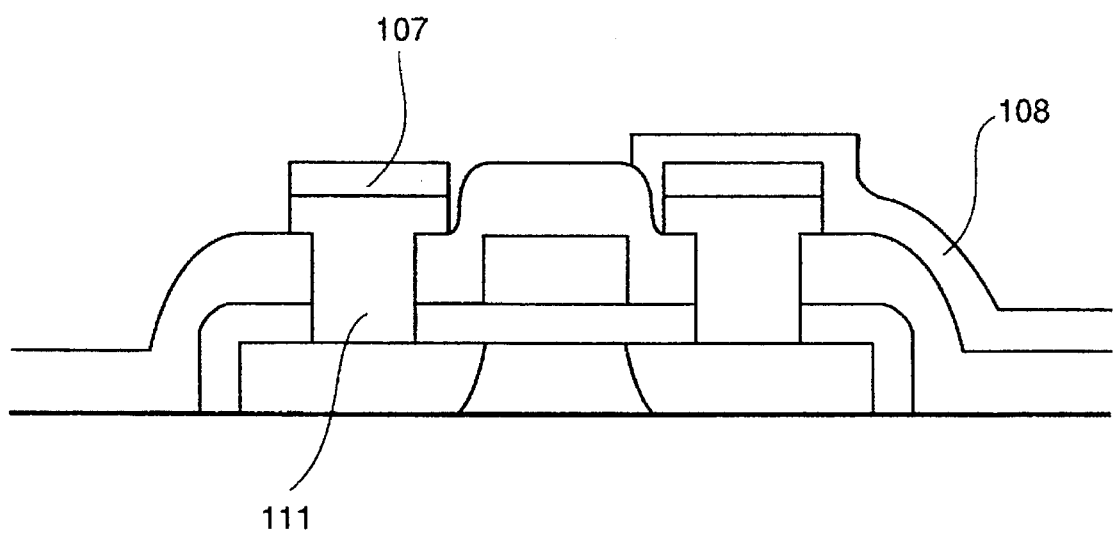

FIG. 5 is a schematic cross sectional view which illustrates another structure of the contact structure of a liquid crystal display apparatus to which the present invention is applied. The structure shown in FIG. 3 has an arrangement similar to that according to the first embodiment except for the through hole, and Al 111 and TiN or a TiON 107 are continuously sputtered followed by sputtering, and an ITO film 108 is formed.

Even if the size of the through hole was 2 to 2.5 μm square, a contact resistance of 30 to 50Ω was maintained.

The structure shown in FIG. 3 enables excellent contact characteristics to be obtained even if Si contains impurities by a low concentration of $10^{20}$ or lower.

As described above, according to the present invention, a connector and a semiconductor apparatus can be provided which are able to overcome the problem of the electrical characteristics dispersion between the contact portion and the semiconductor apparatus and the problem of the delay of the signal transmission.

According to the present invention, a connector and a semiconductor apparatus can be provided which are able to overcome the problems of the deterioration of the electrical characteristics and the reliability taken place due to the connection portion.

Furthermore, use of the connector according to the present invention in a liquid crystal display apparatus will enable the liquid crystal display apparatus to significantly prevent the dispersion of display taken place among pixels and to have excellent display performance because of satisfactory signal response performance.

Although the foregoing embodiments have the arrangement that the present invention is applied to the liquid crystal display apparatus, the present invention may be applied to an apparatus comprising a transparent electrode made of an oxide containing indium such as ITO.

The apparatus of this type is exemplified by a photoelectrical conversion apparatus typified by an optical sensor. An arrangement of this type enables the total reading performance to be improved because the dispersion of the reading performance among the pixels can be prevented and a small signal can be outputted.

As described above, according to the present invention, a semiconductor apparatus having excellent and stable contact characteristics can be obtained. Furthermore, the use of the semiconductor apparatus will provide a liquid crystal display apparatus and a photoelectrical conversion apparatus that exhibit high image quality.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A connector for establishing an electrical connection between a silicon semiconductor region and an oxide containing indium, said connector comprising a Ti compound containing N.

2. The connector according to claim 1, wherein said oxide containing indium is an oxide of indium and tin.

3. The connector according to claim 1, wherein said Ti compound containing N contains oxygen atoms.

4. The connector according to claim 1, wherein said Ti compound containing N is $TiO_aN_b$, where $a>0$ and $b \geq 1$.

5. The connector according to claim 1, wherein said Ti compound containing N is $TiN_c$, where $C \geq 1$.

6. The connector according to claim 1, further comprising aluminum, wherein said aluminum is interposed between said silicon semiconductor region and said Ti compound.

7. A semiconductor apparatus comprising:

a silicon semiconductor region;

an oxide containing indium and which is electrically connected to said region; and a connector formed between said region and said oxide and arranged to establish an electrical connection between said region and said oxide, and comprising a Ti compound containing N.

8. A semiconductor apparatus according to claim 7, wherein said oxide containing indium is an oxide of indium and tin.

9. A semiconductor apparatus according to claim 7, wherein said Ti compound containing N contains oxygen atoms.

10. A semiconductor apparatus according to claim 7, wherein said Ti compound containing N is $TiO_aN_b$, and where $a>0$ and $b \geq 1$.

11. A semiconductor apparatus according to claim 7, wherein said Ti compound containing N is $TiN_c$, wherein $c \geq 1$.

12. A semiconductor apparatus according to claim 7, wherein said connector further comprising aluminum, and wherein said aluminum is interposed between said silicon semiconductor and said Ti compound containing N.

13. A semiconductor apparatus according to claim 7, wherein said silicon semiconductor region forms at least a portion of a transistor.

14. A semiconductor apparatus according to claim 7, wherein said semiconductor apparatus constitutes as least a portion of a liquid crystal display apparatus or a photoelectric conversion apparatus.

* * * * *

UNITED STATES PATENT AND TRADEMARK OFFICE
CERTIFICATE OF CORRECTION

PATENT NO. : 5,650,664

DATED : July 22, 1997

INVENTOR(S): MASARU SAKAMOTO

It is certified that error appears in the above-identified patent and that said Letters Patent is hereby corrected as shown below:

ON THE TITLE PAGE AT [56]
  FOREIGN PATENT DOCUMENTS,"62-250422      10/1977/Japan"
    should read             --62-250422      10/1987/Japan--.

SHEET 2 OF 6
  FIG 2(d)-(e), "TRASISTOR" (both occurrences) should read
    --TRANSISTOR--.

SHEET 3 OF 6
  FIG 2(f), "TRASISTOR" should read --TRANSISTOR--.

COLUMN 2
  Line 53, "which" should read --whereas--.

COLUMN 6
  Line 7, "Electrohcem." should read --Electrochem.--;
  Line 59, "raise" should read --raised--.

COLUMN 8
  Line 13, "decrease" should read --decreases--;
  Line 61, "electrically" should read --electrical--;
  Line 62, "electrically" should read --electrical--;

UNITED STATES PATENT AND TRADEMARK OFFICE
CERTIFICATE OF CORRECTION

PATENT NO. : 5,650,664

DATED : July 22, 1997

INVENTOR(S): MASARU SAKAMOTO

It is certified that error appears in the above-identified patent and that said Letters Patent is hereby corrected as shown below:

COLUMN 10
  Line 66, "particularly," should read --particularity,--.

COLUMN 12
  Line 23, "as" should read --at--.

Signed and Sealed this

Sixteenth Day of February, 1999

Attest:

Attesting Officer

*Acting Commissioner of Patents and Trademarks*